United States Patent
Hirabayashi

(10) Patent No.: US 6,917,259 B2
(45) Date of Patent: Jul. 12, 2005

(54) HIGH-FREQUENCY MODULE SUBSTRATE DEVICE

(75) Inventor: Takayuki Hirabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 10/416,409

(22) PCT Filed: Sep. 12, 2002

(86) PCT No.: PCT/JP02/09359
§ 371 (c)(1),
(2), (4) Date: May 12, 2003

(87) PCT Pub. No.: WO03/026060
PCT Pub. Date: Mar. 27, 2003

(65) Prior Publication Data
US 2004/0036551 A1 Feb. 26, 2004

(30) Foreign Application Priority Data
Sep. 13, 2001 (JP) ........................................ 2001-278541

(51) Int. Cl.[7] .............................. H01P 1/10; H01P 5/12; B81B 7/00
(52) U.S. Cl. ........................ 333/105; 333/101; 333/109; 333/185
(58) Field of Search ................................ 333/101, 103, 333/105, 109, 185, 262

(56) References Cited

U.S. PATENT DOCUMENTS 5,103,293 A  *  4/1992  Bonafino et al. ............ 257/702
5,526,172 A  *  6/1996  Kanack ........................ 359/291
5,742,215 A     4/1998  Park

FOREIGN PATENT DOCUMENTS

| JP | 07-147503 | 6/1995 | ........... H01P/1/205 |
| JP | 09-116305 | 5/1997 | |
| JP | 2000-031738 | 1/2000 | ............ H03B/5/18 |
| JP | 2001-084884 | 3/2001 | .......... H01H/59/00 |

* cited by examiner

Primary Examiner—Robert Pascal
Assistant Examiner—Dean Takaoka
(74) Attorney, Agent, or Firm—Sonnenschein, Nath & Rosenthal LLP

(57) ABSTRACT

A high frequency module substrate device used in a high frequency module apparatus, which is adapted for switching pass-frequency characteristic of band-pass filter by switching and is adapted so that optimum band-pass filter characteristic is obtained in all pass-frequency bands, wherein a thin film capacitor element (18) is constituted between a base substrate (2) in which the uppermost layer is flattened with organic substrate being as core substrates (5), (6) to constitute a buildup formation surface (16) and a high frequency circuit unit (3) of lumped parameter design formed on the buildup formation surface in a laminated manner to carry out switching of load of parallel capacity with respect to a coupler (11) having frequency characteristic of λ/4 which has been caused to undergo distributed parameter design at the base substrate portion side of the thin film capacitor through switch means (4).

4 Claims, 9 Drawing Sheets

HIGH-FREQUENCY MODULE SUBSTRATE DEVICE

BACKGROUND OF THE INVENTION

The present invention relates to a high frequency module substrate device used in a high frequency module apparatus, and more particularly to a high frequency module substrate device used in a high frequency module apparatus constituting a micro-communication functional module mounted at various electronic equipments such as personal computer, mobile telephone, video equipment or audio equipment, etc. and having information communication function and/or storage function, etc.

Various information such as music, voice (sound) or image, etc. have been handled with ease also by small sized information processing device such as personal computer or mobile computer, etc. with digitization of data. Band compression of such information is realized by voice Codec technology or image Codec technology, and environment in which such information are easily and efficiently delivered or distributed to various communication terminal equipments by digital communication or digital broadcast is being arranged. For example, audio data and video data (hereinafter referred to as AV data) can be also received at the outdoors by mobile telephone.

Meanwhile, transmission/reception system for data, etc. is diversely utilized by construction of suitable network system also within small scale area including home. As a network system, attention is drawn to various next generation wireless systems like, e.g., wireless LAN system of 2.45 GHz band proposed in the IEEE802.11b, short-range wireless communication system called Bletooth, etc., and/or narrow band wireless communication system of 5 GHz band proposed in the IEEE802.11a along with very weak radio wave system using 400 MHz band or PHS (Personal Handy-Phone System) using 1.90 GHz band. In the transmission/reception system, by effectively utilizing such wireless network system, transmission/reception of various data and/or access to various communication networks or transmission/reception of data with respect thereto can be carried out with ease and without intervention of relay device, etc. at various places such as inside of home or outdoor, etc.

On the other hand, in the transmission/reception system, realization of compact, light and portable communication terminal equipment having the above-described communication function becomes indispensable. In the communication terminal equipment, since it is necessary to carry out modulation/demodulation processing of analog high frequency signal at the transmitting/receiving unit, a high frequency transmitting/receiving circuit by the superheterodyne system adapted for once carrying out conversion into intermediate frequency from transmit/receive signal is generally provided.

In the high frequency transmitting/receiving circuit, an antenna unit including an antenna and a changeover switch and serving to receive or transmit information signal, and a transmission/reception switcher for carrying out switching between transmission and reception are provided. In the high frequency transmitting/receiving circuit, a receiving circuit unit composed of a frequency converting circuit unit and a demodulation circuit unit, etc. is provided. In the high frequency transmitting/receiving circuit, a transmitting circuit unit composed of a power amplifier or a drive amplifier and a modulation circuit unit, etc. is provided. In the high frequency transmitting/receiving circuit, a reference frequency generating circuit unit adapted for delivering reference frequency to the receiving circuit unit and the transmitting circuit unit is provided.

In such high frequency transmitting/receiving circuit, there is employed the configuration in which the number of large functional components such as various filters respectively inserted between respective stages, local oscillator (VCO) and SAW filter, etc., and the number of passive components such as inductor, resistor and capacitor, etc. peculiar to the high frequency analog circuit such as matching circuit or bias circuit, etc. are very large. In the high frequency transmitting/receiving circuit, IC configuration of respective circuit units can be realized. However, filters inserted between respective stages cannot be taken into IC. For this reason, matching circuit is also required as external attachment component. Accordingly, the high frequency transmitting/receiving circuit becomes large as a whole. Thus, this constitutes great obstacle in miniaturization and realization of light weight of communication terminal equipment.

On the other hand, at the communication terminal equipment, a high frequency transmitting/receiving circuit by the direct conversion system of carrying out transmission/reception of information signal without carrying out conversion into intermediate frequency is also used. In such a high frequency transmitting/receiving circuit, information signal received by the antenna unit is delivered to demodulation circuit unit through transmission/reception switcher so that base band processing is directly carried out. In the high frequency transmitting/receiving circuit, information signal generated at the source is directly modulated into a predetermined frequency band without being converted into intermediate frequency at modulation circuit unit, and is transmitted from the antenna unit through amplifier and transmission/reception switcher.

Since such a high frequency transmitting/receiving circuit has the configuration adapted for carrying out direct detection without carrying out conversion of intermediate frequency with respect to information signal to thereby carry out transmission/reception, the number of parts such as filter is reduced so that simplification of the entire configuration is realized. Thus, configuration closer to one chip is expected. However, also in the high frequency transmitting/receiving circuit by this direct conversion system, countermeasure of filter or matching circuit disposed at the succeeding stage is required. In addition, since the high frequency transmitting/receiving circuit carries out amplification of one time at the high frequency stage, it becomes difficult to obtain sufficient gain. As a result, it is necessary to carry out amplifying operation also at the base band unit. Accordingly, there is the problem that the high frequency transmitting/receiving circuit requires cancel circuit for DC offset and additional low-pass filter, and the entire power consumption becomes large.

In both the superheterodyne system and the direct conversion system, as described above, the conventional high frequency transmitting/receiving circuits could not obtain sufficient characteristic with respect to the requirement specification such as miniaturization and/or lightweight, etc. of communication terminal equipment. For this reason, with respect to the high frequency transmitting/receiving circuit, various attempts are made in connection with module in which miniaturization is realized by simple configuration where, e.g., Si-CMOS circuit, etc. is caused to be base. Namely, one of such attempts is, e.g., a method of forming passive elements of good characteristic on Si substrate, and of making filter circuit and/or resonator, etc. on LSI, and further also integrating logic LSI of the base band portion to thereby manufacture the so-called one chip high frequency transmitting/receiving module.

In such Si substrate high frequency transmitting/receiving module, how inductor of good performance is formed on LSI becomes extremely important. In the high frequency transmitting/receiving module, for the above reason, e.g., a large recessed portion is formed in correspondence with the portion where inductor is to be formed of Si substrate and $SiO_2$ insulating layer to form a first wiring layer in a manner faced to this recessed portion, and to form a second wiring layer which closes the recessed portion thus to constitute inductor portion. Moreover, in the high frequency transmitting/receiving module, as another countermeasure, a configuration such that a portion of wiring pattern is raised from the substrate surface so that it is caused to float in air is provided so that inductor portion is formed. Such high frequency transmitting/receiving modules both have the problem that the step for forming the inductor portion is extremely complicated so that cost is increased by increase of the step.

On the other hand, in one chip high frequency transmitting/receiving module, electric interference of Si substrate intervening between high frequency circuit unit of analog circuit and base band circuit unit of digital circuit becomes great problem. With respect to the high frequency transmitting/receiving module, there are proposed, e.g., a module in which $SiO_2$ layer is formed on Si substrate thereafter to form, by the lithographic technology, a layer where passive element is to be formed, and a module in which a layer where passive element is to be formed is formed on glass substrate by the lithographic technology.

In the Si substrate high frequency transmitting/receiving module, passive elements such as inductor portion, resistor body portion or capacitor portion, etc. are formed along with wiring pattern within the layer where passive element is to be formed by the thin film formation technology or the thick film formation technology so that they are caused to be of multi-layer structure. In the high frequency transmitting/receiving module, terminal portions connected to internal wiring pattern are formed through via (junction throughole) on the layer where passive element is to be formed, and circuit elements such as high frequency IC or LSI, etc. are directly mounted onto these terminal portions by the flip chip mounting method, etc. Such high frequency transmitting/receiving module is mounted at, e.g., mother board (substrate), etc. to thereby partition the high frequency circuit portion and the base band circuit portion so that electric interference between both portions can be suppressed. However, while the high frequency transmitting/receiving module functions when respective passive elements are formed within the layer where passive element is to be formed, there is the problem that Si substrate having conductivity constitutes obstacle to satisfactory high frequency characteristics of respective passive elements.

In the glass substrate high frequency transmitting/receiving module, glass substrate is used as base substrate to thereby solve the above-described problems resulting from the Si substrate of the Si substrate high frequency transmitting/receiving module. In the high frequency transmitting/receiving module, passive elements such as inductor portion, resistor body portion or capacitor portion, etc. are formed along with the wiring pattern within the layer where passive element is to be formed by the thin film formation technology or the thick film formation technology so that they are caused to be of multi-layer structure. The high frequency transmitting/receiving module is caused to be of the configuration in which terminal portions connected to internal wiring pattern are formed through via, etc. on the layer where passive element is to be formed, and circuit elements such as high frequency IC or LSI, etc. are directly mounted onto these terminal portions by the flip-chip mounting method, etc.

In the high frequency transmitting/receiving module, glass substrate which has no conductivity is used so that the degree of capacitive coupling between glass substrate and the layer where passive element is to be formed is suppressed to have ability to form passive element having satisfactory high frequency characteristic within the layer where passive element is to be formed. In the high frequency transmitting/receiving module, in order that it is mounted onto, e.g., mother board (substrate), etc., terminal pattern is formed on the surface of the layer where passive element is to be formed, and connection to the mother board (substrate) is carried out by the wire bonding method, etc. Accordingly, in the high frequency transmitting/receiving module, terminal pattern formation step and wire bonding step are required.

In the one chip high frequency transmitting/receiving module, as described above, a layer where a passive element is to be formed of high accuracy is formed on base substrate. For the base substrate, in carrying out thin film formation of the layer where passive element is to be formed, heat resistance characteristic with respect to rising of the surface temperature at the time of sputtering, holding of focal depth at the time of lithography and the contact alignment characteristic at the time of masking are required. For this reason, the base substrate is required to have flatness of high accuracy, and is required to have insulating property, beat resistance characteristic and chemical resistance, etc.

The Si substrate and the glass substrate have such characteristics to permit formation of passive elements of low cost and low loss by the process different from LSI. In the Si substrate or the glass substrate, as compared to the method of forming pattern, etc. by printing or the wet type etching method of forming wiring pattern on printed wiring board used in the conventional ceramic module technology, formation of passive element of high dimensional accuracy is permitted, and the area of the element size can be reduced to about $\frac{1}{100}$ thereof. The Si substrate and the glass substrate also make it possible to increase the use limit frequency band of the passive element up to 200 GHz.

Such high frequency transmitting/receiving module is required to form pattern of the high frequency signal system through the wiring layer formed on Si substrate or glass substrate as described above, and to carry out supply wiring for power supply and/or ground or control system signal wiring. As a result, electric interference takes place between these respective wirings, and the problem of increase in cost due to the fact that wiring layer is formed so that it is caused to be of the multi-layer structure takes place. Moreover, the high frequency transmitting/receiving module is mounted onto one surface of interposer substrate and the entirety thereof is sealed by insulating resin so that package structure is realized. The interposer substrate is adapted so that pattern wiring layers are formed on both surfaces of the face and the back, and a large number of lands are formed around the area where the high frequency transmitting/receiving module is mounted. The package electrically connects this high frequency transmitting/receiving module and the lands by the wire bonding in the state where the high frequency transmitting/receiving module is mounted on the interposer substrate to carry out supply of power and/or transmission/reception of signal. Accordingly, at the high frequency transmitting/receiving module, wiring pattern for connecting these mounting parts and/or connection terminals to wire bonding, etc. are formed on the surface layer where high frequency ICs and/or chip components, etc. are mounted.

Since the high frequency transmitting/receiving module is caused to be of package structure through the interposer substrate as described above, there is the problem that thickness or area of the package becomes large. The high frequency transmitting/receiving module also has the problem that cost of the package is increased. Further, in the Si substrate or the glass substrate high frequency transmitting/receiving module, shield cover is provided in a manner to cover circuit elements such as high frequency IC or LSI, etc. mounted thereon. In this case, there is also the problem that such module becomes large by the structure employed for radiating heat produced from these circuit elements. Further, in the high frequency transmitting/receiving module, there was the problem that relatively expensive Si substrate or glass substrate is used so that cost is increased.

Meanwhile, in the general high frequency transmitting/receiving module 100 of the above-described superheterodyne system, etc., a receive signal received by an antenna 101 like antenna I/O circuit unit shown in FIG. 1 is passed through a band-pass filter 102 which passes only a predetermined carrier frequency band, and is then inputted to a low-noise amplifier 104 of the receiving side through a switch circuit 103. In the high frequency transmitting/receiving module 100, an output signal superimposed on a predetermined carrier frequency is inputted to the band-pass filter 102 through the switch circuit 103 switched to the output side from a power amplifier 105, and is passed through this band-pass filter 102. The output signal thus obtained is outputted from the antenna 101.

On the other hand, in the high frequency transmitting/receiving module, it is preferable that such module is commonly applied also to various wireless network systems in which carrier waves of different frequencies where the carrier frequency is caused to be 5 GHz or 2.45 GHz, etc. are used as described above. In such a common use type high frequency transmitting/receiving module 110, as shown in FIG. 2, for example, there is provided an antenna I/O circuit unit having band switching function to pass a signal superimposed on a carrier wave of frequency adapted when the system is used.

Namely, the high frequency transmitting/receiving module 110 comprises, as shown in FIG. 2, an antenna 111, a first band changeover switch circuit 112, a first band-pass filter 113 which passes carrier wave signal of frequency of 2.45 GHz and a second band-pass filter 114 which passes a carrier wave signal of frequency of 5 GHz which are connected in parallel to this band changeover switch circuit 112 so that path switching is carried out, a second band changeover switch circuit 115, an input/output changeover switch 116, and a broad band low noise amplifier 117 of the receiving side and a broad band power amplifier 118 of the output side. The first band changeover switch circuit 112 and the second band changeover switch circuit 115 become operative in an interlocking manner to constitute path of carrier frequency selected between the antenna 111 and the input/output changeover switch circuit 116.

In the high frequency transmitting/receiving module 110, switching operation of the first band changeover switch circuit 112 and the second band changeover switch circuit 115 is carried out in accordance with the system adaptation carrier frequency so that receive signal from the antenna 111 is delivered to the first band-pass filter 113 or the second band-pass filter 114 which has been selected. In the high frequency transmitting/receiving module 110, receive signal passed through each band-pass filter is inputted to the broad band low noise amplifier 117 through the second band changeover switch circuit 115 and the input/output changeover circuit 116 switched to the input side.

In the high frequency transmitting/receiving module 110, switching operation of the first band changeover switch circuit 112 and the second band changeover switch circuit 115 is carried out in accordance with carrier frequency adapted to the system. In the high frequency transmitting/receiving module 110, an output signal superimposed on a predetermined carrier frequency is inputted to the selected band-pass filter 113 or 114 through the input/output changeover switch circuit 116 switched to the output side of the broad band power amplifier 118 and the second band changeover switch circuit 115. In the high frequency transmitting/receiving module 110, the output signal is passed through the band-pass filter 113 or 114, and is outputted from the antenna 111 through the first band changeover switch circuit 112.

In the high frequency transmitting/receiving module 110, since plural circuit units for carrying out band switching as described above are connected to the antenna 111, the circuit configuration becomes complicated. In the high frequency transmitting/receiving module 110, e.g., functional components which can process two kinds of carrier frequencies are used as the antenna 111 and/or amplifiers 117, 118 are used so that countermeasure is taken without increasing the number of parts (components), but it is necessary to increase the number of band changeover switches 112, 115 and/or band-pass filters 113, 114 in accordance with kind of carrier frequency.

In the high frequency transmitting/receiving module 110, for the above reason, there are the problems that cost is increased by increase in the number of parts and realization of adaptation to miniaturization required becomes difficult by enlargement of the mounting substrate. In the high frequency transmitting/receiving module 110, since a large number of circuit elements are mounted with high density on mounting substrate of a limited area, there was the problem that passing loss by respective circuit elements is increased so that the characteristic is deteriorated. In the high frequency transmitting/receiving module 110, since circuit patterns are formed every carrier frequencies on the mounting substrate, there is the problem that it is necessary to provide solid plane ground, etc. which ensures mutual isolation so that the circuit pattern design becomes troublesome. Thus, there is the problem that the mounting substrate also further becomes large.

Meanwhile, in the high frequency transmitting/receiving module, when such module is used in a band where the carrier frequency is above about 5 GHz, the circuit configuration using the so-called distributed parameter element such as Transmission Line, Coupling Line or Stub, etc. can still more improve the characteristic with respect to the circuit configuration using the so-called lumped parameter (concentrated constant) element such as inductor or capacitor, etc. Moreover, in the high frequency transmitting/receiving module, according as the frequency band of carrier wave used increases, band-pass filter (BPF), etc. is constituted by distributed parameter element as functional element, and elements such as inductor or capacitor, etc. are used as restricted functional component such as choke or decoupling, etc.

Namely, in the high frequency transmitting/receiving module, in the case where frequency of carrier wave is 2.45

GHz, wavelength dobles as compared to the case where frequency of carrier wave is 5 GHz As a result, when such module is constituted with lumped parameter element, element size becomes large. Accordingly, the high frequency transmitting/receiving module is caused to be of the configuration in which band-pass filter of lumped parameter design and band-pass filter of distributed parameter design are mounted on the mounting substrate in a mixed manner in the case where common specification of carrier wave having frequency of 2.45 GHz and carrier wave having frequency of 5 GHz is realized.

The applicant of the present application has proposed, in the specification and drawings of PCT/JP02/04178 and the specification and drawings of PCT/JP02/04409, substrate device for high frequency module including a high frequency circuit unit in which a thin film layer is formed on a relatively inexpensive organic base substrate, and the surface of this thin film layer is flattened to form, as film, band-pass filter of distributed parameter design and spiral inductor of lumped parameter design of high accuracy. This high frequency module substrate device is characterised in that passive elements of high accuracy and/or high density wiring layer are permitted to be formed on base substrate so that high function, thin thickness, miniaturization and low cost are realized.

In the high frequency module, in order to realize miniaturization, it is effective that band-pass filter is formed on base substrate formed by base material having high dielectric constant such as Si substrate or glass substrate, etc. Namely, in the high frequency module, base substrate of high dielectric constant is used so that different wavelength contractions take place at micro-strip line (surface layer) and strip line (inner layer), thus making it possible to shorten resonator length used for filter. The wavelength contraction takes place at $\lambda_o/\sqrt{\epsilon w}$ at the surface layer, and takes place at $\lambda_o/\sqrt{\epsilon r}$ at the inner layer ($\epsilon r$: specific dielectric constant of base substrate).

Here, $\lambda_o$ is wavelength in vacuum, $\epsilon w$ is effective specific dielectric constant and dielectric constant determined by the electromagnetic distribution of air and dielectric body, and $\epsilon r$ is specific dielectric constant.

In the above-described high frequency module substrate device, since spiral inductor is constituted in the area of design sufficiently smaller than wavelength by the lumped parameter design, there is no possibility that influence of wavelength contraction may take place. In the high frequency module substrate device, since spiral inductor outputs high Q value as inductor, it becomes necessary to reduce parasitic capacity by coupling to the ground layer or the peripheral metallic pattern of the base substrate.

In the high frequency module substrate device, it is preferable to form base substrate by organic substrate material having a specific dielectric constant as small as possible in order to reduce the parasitic capacity of spiral inductor to realize improvement in the characteristic. Such substrate material is extremely effective because unnecessary parasitic capacity is similarly reduced also with respect to lumped parameter element such as MIM capacitor (Metal Isolator Metal Capacitor) or thin film resistor, etc.

The distributed parameter element and the lumped parameter element have characteristics contrary to each other with respect to the dielectric constant specification of the base substrate as described above. Accordingly, in the high frequency module substrate device, the base substrate is required to have such a selection to exhibit either one of the characteristics of the distributed parameter element and the lumped parameter element and to sacrifice the other characteristic, and has the problem that the characteristics of the both elements cannot be performed at the same time. In the high frequency module substrate device on which plural circuit units for carrying out band switching are mounted, since band-pass filters are constituted by the lumped parameter design and the distributed parameter design in accordance with carrier frequency band, such problem further becomes great.

SUMMARY OF THE INVENTION

An object of the present invention is to provide a novel high frequency module substrate device which can solve problems that high frequency module substrate devices as described above have.

Another object of the present invention is to provide a high frequency module device adapted for switching pass-frequency characteristic of band-pass filter by switching, and adapted so that optimum band-pass filter characteristics are also obtained in all pass-frequency bands.

A high frequency module substrate device according to the present invention proposed in order to attain the above-described objects comprises: a base substrate in which a wiring layer is formed through an insulating layer on the principal surface of a core substrate comprised of an organic substrate, and the principal surface of the uppermost layer is flattened so that a buildup formation surface is constituted; a high frequency circuit unit in which a wiring layer is formed through an insulating layer on the buildup formation surface of this base substrate; and select switch means. At the base substrate, there is formed at least a distributed parameter circuit pattern including a coupler of one side short type line and one side open type line having frequency characteristic of $\lambda/4$ is formed within the wiring layer. At the high frequency circuit unit, passive elements are formed as thin film within the wiring layer, and a lumped parameter circuit pattern formed as thin film in correspondence with the distributed parameter circuit pattern of the base substrate side to constitute thin film capacitor is formed as thin film. The select switch means is provided between connection patterns which carry out interlayer connection between the thin film capacitor and the coupler to switch electrical connecting state between the thin film capacitor and the coupler.

In the high frequency module substrate device according to the present invention, the thin film capacitor is connected to input/output terminal portions for high frequency signal to the coupler through the select switch means. Further, in the high frequency module substrate device, MEMS switch is used as the select switch means.

In the high frequency module substrate device according to the present invention, the coupler having frequency characteristic of $\lambda/4$ which has been caused to undergo distributed parameter design functions as a band-pass filter having pass-characteristic where carrier wave of, e.g., 5 GHz band is permitted to be passed. In the high frequency module substrate device, the thin film capacitor is connected to the coupler through the select switch means so that parallel capacity is loaded, whereby the coupler functions as a band-pass filter having pass-characteristic where carrier wave of frequency of, e.g., 2.45 GHz band is permitted to be passed. From this fact, the high frequency module substrate device can be compatibly used with respect to the wireless system where carrier wave of 2.45 GHz band is used and the wireless system where carrier wave of 5 GHz band is used. In the high frequency module substrate device, wavelength shortening effect by the base substrate of high dielectric constant and reduction of parasitic capacity are realized. As a result, the characteristic of the coupler is satisfactorily held irrespective of the band of carrier frequency. Thus, miniaturization and improvement in the characteristic are realized.

In accordance with the high frequency module substrate device according to the present invention, impedance change takes place at the coupler when load capacity with respect to the thin film capacitor is switched so that band switching is carried out and loss of transmission power takes place, but capacitive load of the thin film capacitor provided at the input terminal portion is switched so that optimum impedance matching is carried out. In the high frequency module substrate device, by this action, band-pass filter characteristic having pass-characteristic where carrier wave of frequency of 5 GHz band is permitted to be passed is held. As a result, loss of transmission power is suppressed. Thus, stable operation is carried out. Further, directly mountable micro MEMS switch is used so that miniaturization of the high frequency module substrate device is realized.

Still more further objects of the present invention and practical merits obtained by the present invention will become more apparent from the description of the embodiments which will be given below with reference to the attached drawings.

BRIEF DESCRIPTION OF THE DRAWINGS

FIGS. 9A and 9B show MEMS switch provided at band-pass filter unit, wherein FIG. 9A is a longitudinal cross sectional view of OFF state and FIG. 9B is an essential part longitudinal cross sectional state of ON state.

DETAILED DESCRIPTION OF THE PRESENTLY PREFERRED EMBODIMENTS

A high frequency module substrate device to which the present invention is applied will now be described in detail with reference to the attached drawings.

Figure 1:
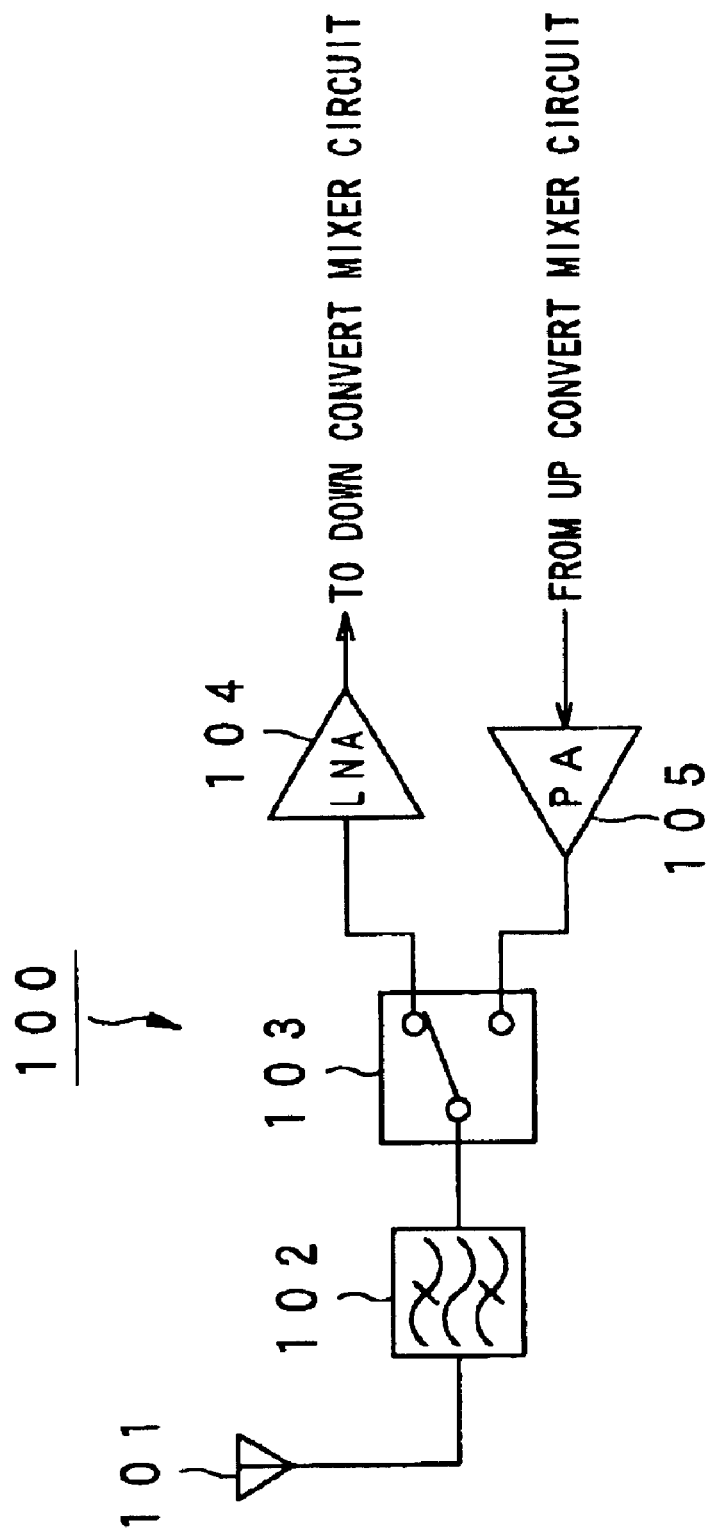
FIG. 1 is a block diagram showing outline of the configuration of antenna input/output unit of a conventional high frequency module.
Figure 2:
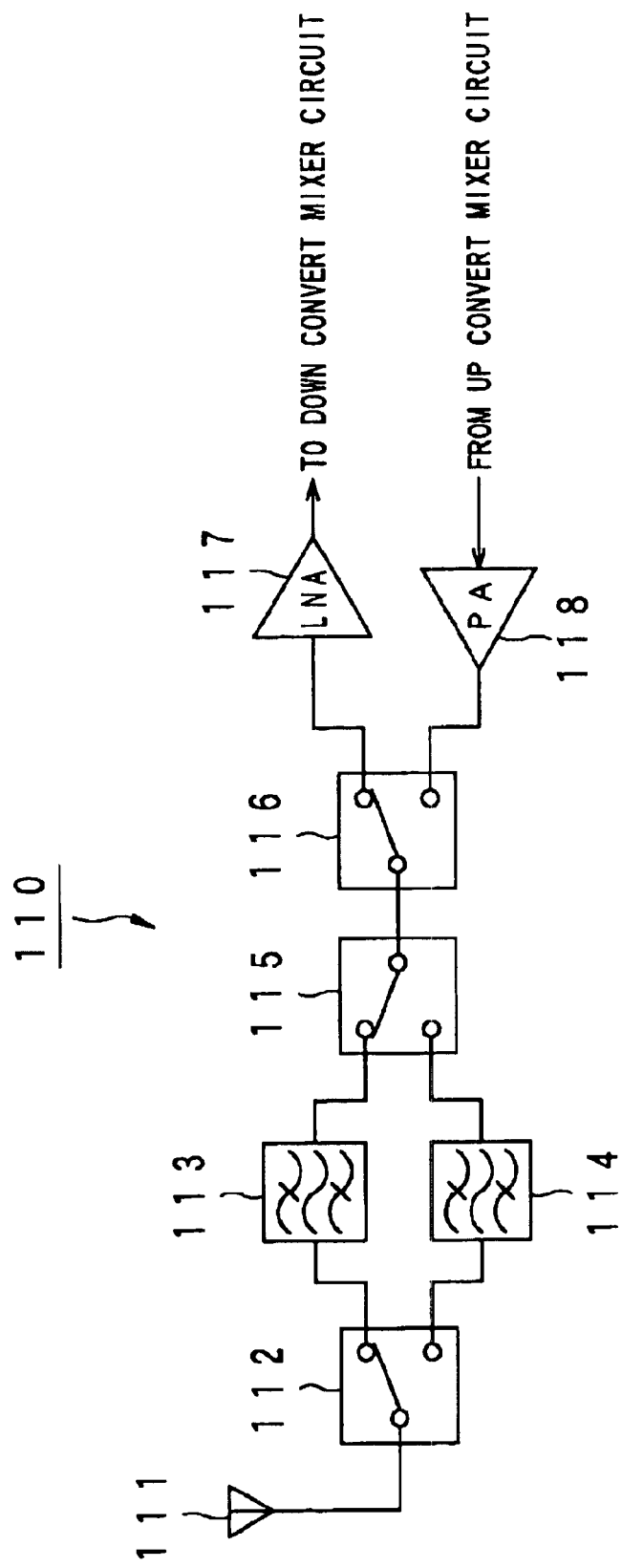
FIG. 2 is a block diagram showing outline of the configuration of antenna input/output unit of a high frequency module having a band switching function.
Figure 3:
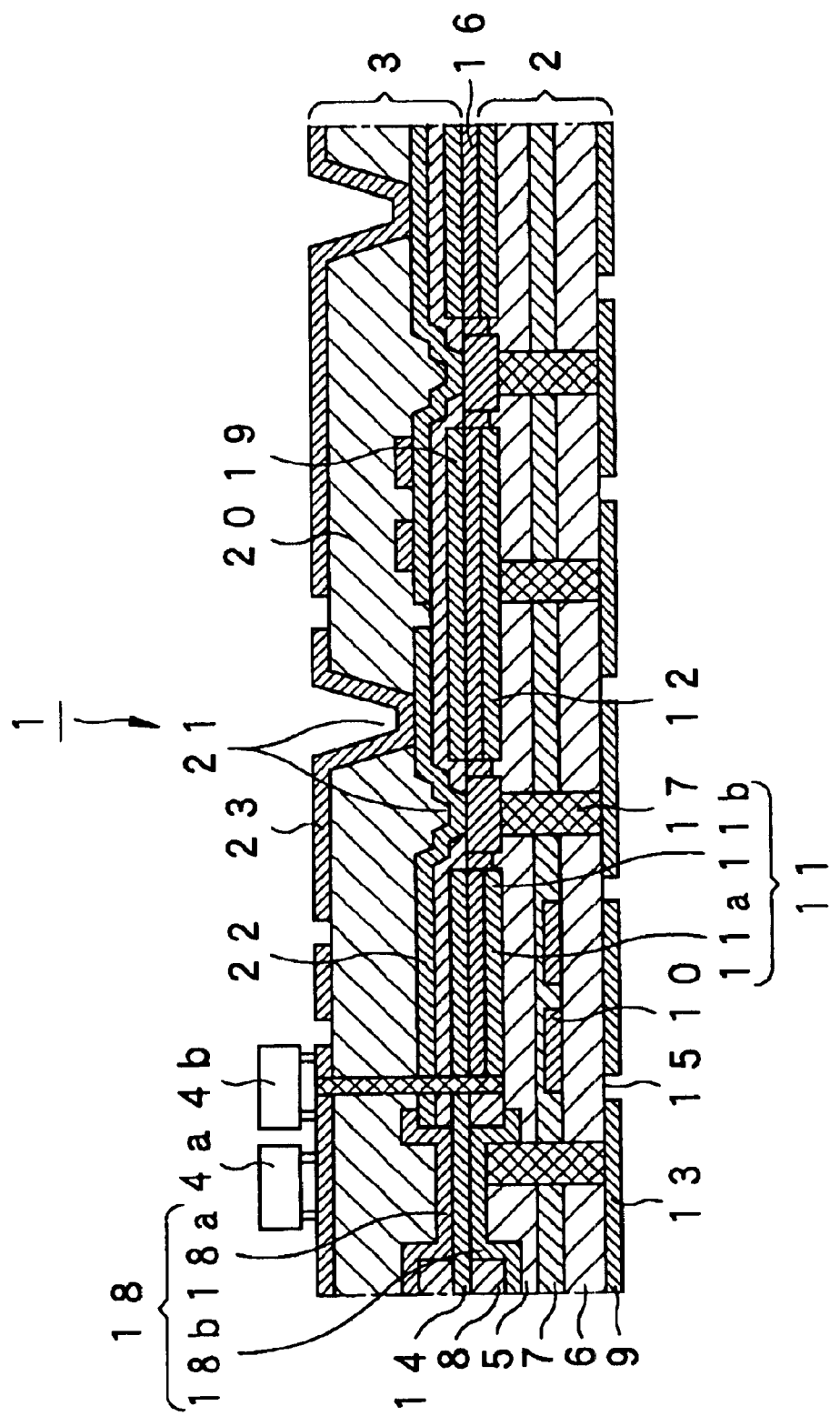
FIG. 3 is a longitudinal cross sectional view showing the essential part of a high frequency module substrate device according to the present invention.

The high frequency module substrate device to which the present invention is applied (hereinafter abbreviated as high frequency module) is constituted as shown in FIG. 3, and constitutes a micro communication function module body having information communication function and/or storage function, etc. and mounted on various electronic equipments such as personal computer, mobile telephone or audio equipment, etc. or inserted into the above-described various equipments or withdrawn therefrom as an option.

In the high frequency module 1 shown in FIG. 3 to which the present invention is applied, although the detail is omitted, there is formed a high frequency transmitting/receiving circuit unit by the superheterodyne system adapted for once carrying out conversion into intermediate frequency from transmit/receive signal, or a high frequency transmitting/receiving circuit unit by the direct conversion system adapted for carrying out transmission/reception of information signal without carrying out conversion into the intermediate frequency, etc. The high frequency module 1 is mounted on one principal surface of interposer substrate (not shown), and is caused to be of package structure by sealing the entirety by synthetic resin having electrically insulating property, e.g., epoxy resin, etc. At the high frequency module 1, peripheral circuit ICs, etc. of the high frequency transmitting/receiving circuit unit are loaded and are mounted on the interposer substrate. For this reason, suitable pattern wirings and/or connection terminal portions are formed at both surfaces of the face and the back.

Figure 4:
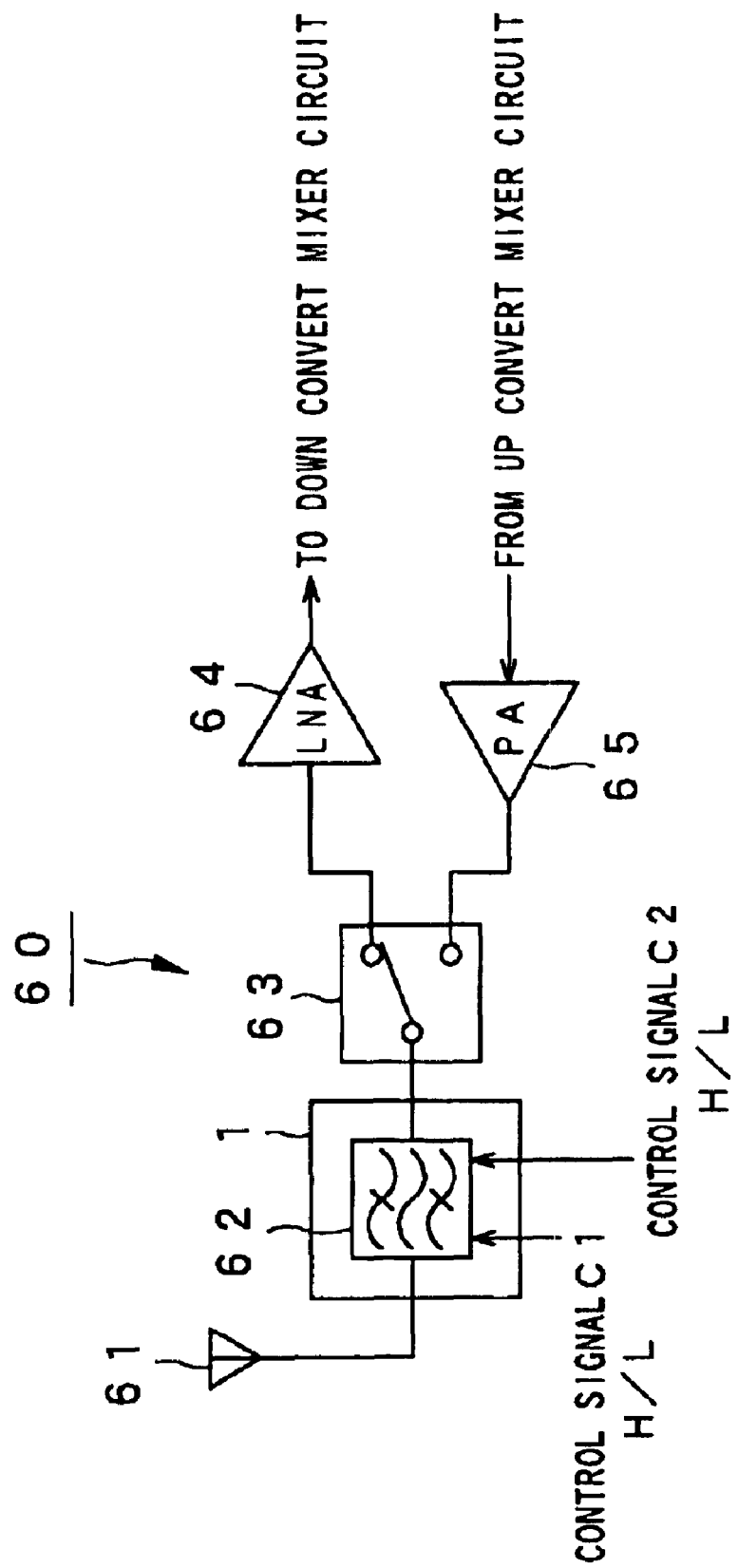
FIG. 4 is a block diagram for explaining outline of the configuration of antenna input/output unit of high frequency module in which high frequency module substrate device is provided.

For example, as shown in FIG. 4, the high frequency module 1 according to the present invention constitutes a portion of an antenna input/output unit 60 of the communication function module, and permits compatible use with respect to, e.g., a signal superimposed on a carrier wave where frequency is caused to be 5 GHz used in the narrow band wireless communication system as prescribed in the IEEE 802.11a and a signal superimposed on a carrier wave where frequency is caused to be 2.45 GHz used in wireless LAN system or Bluetooth, etc. proposed in the IEEE 802.11b which are transmitted and received by an antenna 61. The high frequency module 1 constitutes a band-pass filter section 62 where switching of the pass-frequency characteristic is carried out by control signals C1, C2 of which detail will be described later.

The antenna input/output unit 60 commonly processes, at the band-pass filter circuit unit 62, signal superimposed on carrier wave where frequency is caused to be 5 GHz and signal superimposed on carrier wave where frequency is caused to be 2.45 GHz which have been received by the antenna 61 to input a processed signal to a low noise amplifier 64 of the receiving side through a transmit/receive changeover switch 63. The antenna input/output unit 60 is operative so that when signal superimposed on carrier wave where frequency is caused to be 5 GHz or signal superimposed on carrier wave where frequency is caused to be 2.45 GHz which has been inputted from a power amplifier 65 of the output side is inputted through the transmit/receive changeover switch 63, such inputted signal is commonly processed at the band-pass filter circuit unit 62 of the high frequency module 1 to output it to the antenna 61.

At the antenna input/output unit 60, when, e.g., input in which control signal C1 is "L" and control signal C2 is "H" is carried out with respect to the band-pass filter circuit unit 62, this band-pass filter circuit unit 62 itself performs the pass-characteristic in which carrier wave signal where frequency is caused to be 5 GHz is permitted to be passed. At the antenna input/output unit 60, when, e.g., input in which control signal C1 is "H" and control signal C2 is "L" is carried out with respect to the band-pass filter circuit unit 62, this band-pass filter circuit unit 62 switches from the pass-characteristic in which a carrier wave signal where frequency is caused to be 5 GHz is permitted to be passed to the pass-characteristic in which carrier wave signal where frequency is caused to be 2.45 GHz is permitted to be passed. Accordingly, the high frequency module 1 performs a function to permit multi-band adaptation with respect to the communication function module body.

The control signal C1 and the control signal C2 are inputted from control unit (not shown) to the band-pass filter circuit unit 62 in accordance with carrier frequency used. The control signal Cl carries out switching of capacitive load at the band-pass filter circuit unit 62 as the detail thereof will be described later to thereby control the pass-characteristics of carrier wave signal having frequency of 5 GHz and carrier signal having frequency of 2.45 GHz. The control signal C2 carries out adjustment control of impedance capacity at the band-pass filter circuit unit 62 in which switching of the pass-characteristic where frequency of signal to be passed is switched has been carried out.

Figure 5:
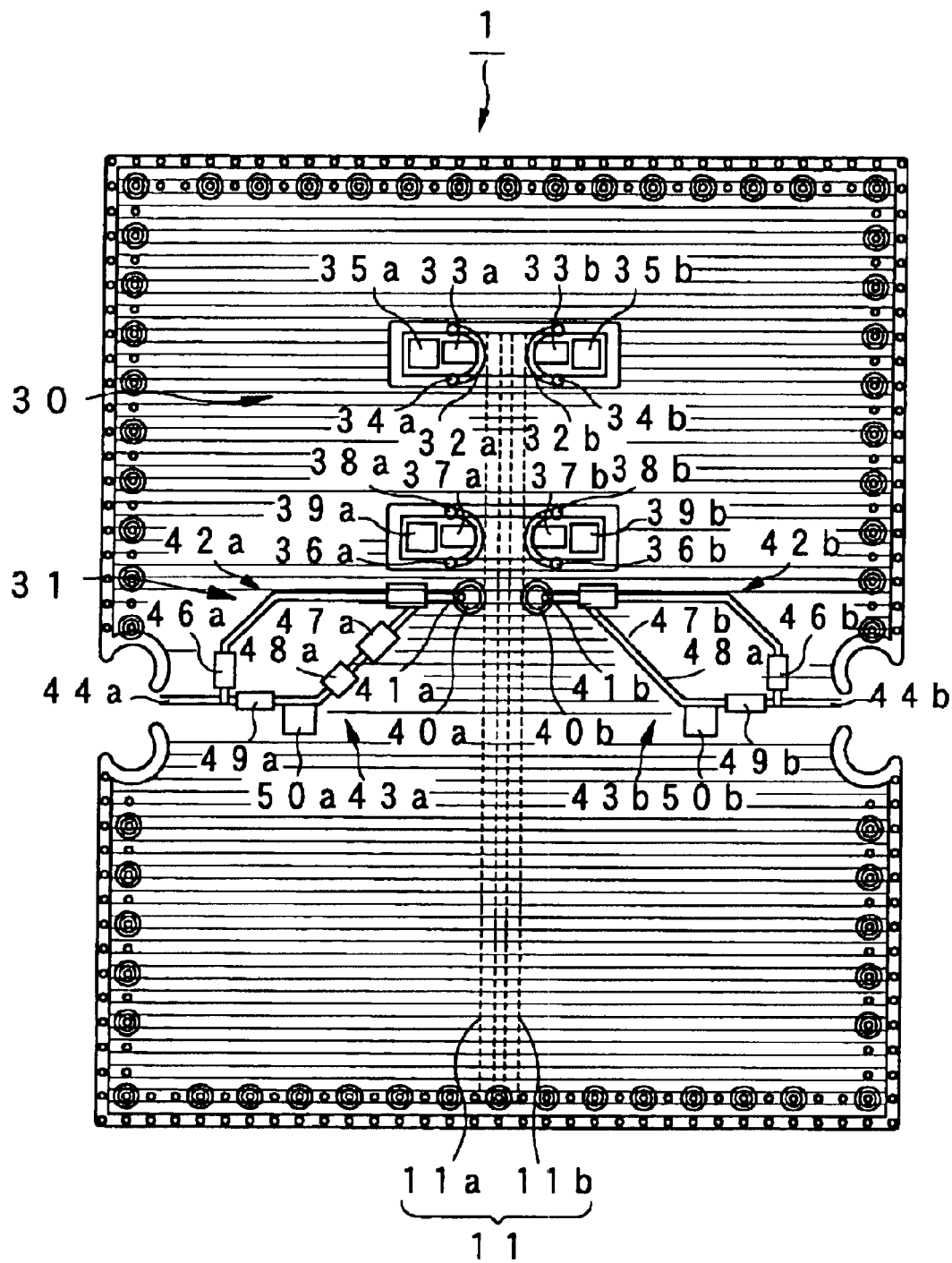
FIG. 5 is a plan view showing, in a perspective manner, band-pass filter unit constituted at the high frequency module substrate device.

The high frequency module 1 comprises, as shown in FIG. 3, a base substrate 2 and a high frequency circuit unit 3 formed on one surface of this base substrate 2 in a laminated manner. In the high frequency module 1, as shown in FIGS. 3 and 5, on the principal surface of the high frequency circuit unit 3, although the detail thereof will be described later, MEMS (Micro-Electro-Mechanical-System) switches 4a, 4b for carrying out band switching are loaded (mounted), and high frequency ICs having peripheral circuit function of the high frequency circuit unit 3 and/or chip components (not shown), etc. are mounted. In the high frequency module 1, the high frequency circuit unit 3 is covered by shield cover (not shown).

In the high frequency module 1, the base substrate 2 is formed by a conventional typical manufacturing method for multi-layer printed board of forming wiring layers of the multi-layer structure on both surfaces of the face and the back of organic substrate. At the base substrate 2, e.g., core substrates 5, 6 comprised of a pair of copper-clad organic substrates are integrally bonded or connected by prepreg 7, and photolithographic processing or etching processing is implemented to copper foil so that a first wiring layer 8 and a second wiring layer 9 are respectively formed at both surfaces of the face and the back and various passive elements are formed as film. It is to be noted that the base substrate 2 may be adapted so that wiring layers of multi-lyer structure and/or passive elements are suitably formed on one surface of both surface substrates through dielectric insulating layer.

The core substrates 5, 6 are formed by base material having low dielectric constant and low Tan δ characteristic, i.e., excellent high frequency characteristic, and mechanical rigidity, heat resistance and chemical resistance. For the core substrates 5, 6, there are used, as base material, e.g., polyphenylene ether (PPE), bismaleimide triazine (BT-resin), polytetrafluoroethylene (Registered Trade Name: Teflon), polyomide, liquid crystal polymer (LCP), polynorbornene (PNB), ceramic or mixture of ceramic and organic base material, and epoxy system substrate FR-5, etc. cheaper than the above-mentioned materials. In the high frequency module 1, such cheap core substrates 5, 6 are used so that reduction of material cost can be realized as compared to relatively expensive Si substrate or glass substrate. As the prepreg 7, e.g., epoxy system adhesive agent resin, acrylic system adhesive agent resin or suitable adhesive agent having low dielectric constant characteristic is used.

At the base substrate 2, a distributed parameter circuit pattern 10 is formed at the inner layer, and a coupler 11 constituting the band-pass filter circuit unit 62 is formed as pattern within the first wiring layer 8 of the core substrate 5 side. As shown in FIG. 5, the coupler 11 is comprised of a pair of rod-shaped conductive patterns 11a, 11b in parallel to each other formed by the distributed parameter design having electric length of about λ/4 of carrier frequency band of 5 GHz and length of about 6 mm. The coupler 11 is adapted so that one conductive pattern 11a constitutes the input unit, and the other conductive pattern 11b constitutes the output unit. At the coupler 11, the respective conductive patterns 11a, 11b are shorted to a solid plane ground portion 12 at one end side and are opened at the other side.

At the base substrate 2, the so-called ground (land) area except for the portion where pattern is to be formed is constituted as the solid plane ground portion 12 at the first wiring layer 8. At the base substrate 2, a large number of lands 13 are formed at the second wiring layer 9 of the core substrate 6 side in the state where they are suitably arranged, and flip-chip mounting is carried out with respect to the interposer substrate through these lands 13.

At the base substrate 2, insulating dielectric material is coated in a manner to cover the first and second wiring layers 8 and 9 respectively formed at both surfaces of the face and the back so that a first insulating layer 14 and a second insulating layer 15 are formed as film. As the insulating dielectric material, insulating dielectric material similar to base material of the above-described core substrates 5, 6 is used. The insulating dielectric material is coated by coating method such as spin-coat method, curtain coat method, roll coat method or dip coat method, etc. At the base substrate 2, polishing processing is implemented to the above-described first and second insulating layers 14 and 15 by using polishing (abrasive) powder consisting of, e.g., mixture liquid of alumina and silica.

In the polishing processing, polishing until respective patterns of the first wiring layer 8 are exposed is carried out with respect to the first insulating layer 14 side, and polishing up to the state where insulating resin layer is somewhat left without exposing the second wiring layer 9 is carried out with respect to the second insulating layer 15 side. Such polishing processing is implemented to the base substrate 2 so that the principal surface of the core substrate 5 is formed as flat surface of high accuracy to constitute a buildup formation surface 16 of the high frequency circuit unit 3. The base substrate 2 is adapted so that the insulating resin layer is left at the second wiring layer 9 side, whereby protection from chemicals or mechanical or thermal load is realized in forming high frequency circuit unit 3 which will be described later. It is to be noted that the second wiring layer 9 is removed after the high frequency circuit unit 3 has been formed. With respect to the base substrate 2, as a method of forming flattened buildup formation surface 16, without limiting to the polishing processing, e.g., Reactive Ion Etching (RIE) or Plasma Etching (PE), etc. may be implemented thereto to carry out flattening.

Via formation step for forming a large number of vias 17 which suitably carry out interlayer connection between the first wiring layer 8 and the second wiring layer 9 is implemented to the base substrate 2. As well known, the via formation step consists of a step of implementing bored hole processing to the integrated core substrates 5, 6 through prepreg by laser or drill, etc., a step of implementing conductive processing of the inner wall by plating, etc. to the portion within the bored hole, a step of embedding conductive past into the bored hole, and a step of forming cover by plating, etc.

At the base substrate 2, a lower electrode 18b which constitutes a thin film capacitor element 18 is formed in cooperation with an upper electrode 18a formed in high frequency circuit unit 3 which will be described layer at the first wiring layer 8. At the base substrate 2, tantalum nitride layer is formed by sputtering method, etc. at the first wiring layer 8 in correspondence with the portion where the thin film capacitor element 18 is to be formed, and selective anode oxidation processing is implemented to this tantalum nitride layer so that tantalum oxide layer of a predetermined film thickness serving as dielectric material of the thin film capacitor element 18 is formed.

Because the base substrate 2 is made or manufactured by the process similar to the manufacturing process for multi-layer wiring substrate conventionally used, mass-productivity is also high. It is to be noted that the manufacturing process for base substrate 2 is not limited to the above-described manufacturing process using a pair of core substrates 5, 6, but may be manufactured, e.g., by the manufacturing process conventionally employed, which comprises forming multi-layer substrate in which copper foils with resin are connected or bonded in succession with respect to copper-clad core substrate.

At the base substrate 2 manufactured in a manner as described above, there is formed, in a laminated manner, high frequency circuit unit 3 including a thin film layer 20 in which the above-described insulating dielectric material is coated onto the buildup formation surface 16 so that a third insulating layer 19 is formed, and the upper electrode 18a of the thin film capacitor element 18 and/or passive elements such as inductor element or resistor element, etc. of which detail is omitted are formed as film by using the thin film formation technology or the thick film formation technology on this third insulating layer 19. At the high frequency circuit unit 3, the third insulating layer 19 is formed on the flattened buildup formation surface 16 with flatness of high accuracy, and a large number of vias 21 for carrying out interlayer connection to a predetermined pattern formed at the first wiring layer 8 of the base substrate 2 side are formed at this third insulating layer 19. At the via formation step, in the case where, e.g., the third insulating layer 19 uses photosensitive resin, mask to which a predetermined patterning has been implemented is attached to implement photolithographic processing or etching processing thereto to make formation thereof.

At the third insulating layer 19, nickel layer is formed as, e.g., barrier layer over the entire surface thereof by, e.g., sputtering method, etc. and copper layer is formed on this nickel layer. Photolithographic processing or etching processing is implemented to copper layer to form a third wiring layer 22 consisting of a predetermined wiring pattern. As the result of the fact that the upper electrode 18a is formed as described above, the third wiring layer 22 constitutes the thin film capacitor element 18 in cooperation with a lower electrode 18b of the first wiring portion 8 of the base substrate 2 side through the third insulating layer 19.

At the thin film layer 20 comprised of multi-wiring layer, although the detail thereof is omitted, e.g., inductor element for high frequency is formed as film within the inner wiring layer, and inductor element for low frequency is formed as film within surface layer side wiring layer of relatively large thickness. The inductor element for high frequency is formed within the inner wiring layer in which thickness has been thinned by the skin effect characteristic of inductor where propagation loss is hardly changed at more than skin effect thickness dependent upon carrier frequency and thickness becomes thinner according as the carrier frequency becomes higher so that improvement in the characteristic is realized. The inductor element for low frequency is formed within the surface layer side wiring layer of large thickness so that improvement in the characteristic is realized by the skin effect characteristic of inductor.

At the thin film layer 20, insulating dielectric material similar to the above-described material is coated on the third wiring layer 22 with accurate thickness so that insulating layer is formed, and metallic thin film is formed on this insulating layer by the sputtering method, etc. thereafter to implement photolithographic processing or etching processing to form a predetermined circuit pattern and/or element portions. With respect to the etching processing of the metallic thin film, etching processing is implemented to copper thin film by using etchant consisting of mixture liquid of systems of nitric acid, sulphuric acid and acetic acid so that the third wiring layer 22 is formed. From this fact, in the case where similar etching processing is implemented, etching would be carried out up to the third wiring layer 22.

Accordingly, the metallic thin film is formed by metallic material such as Al, Pt or Au, etc. having tolerance with respect to the above-described etchant, and it is particularly preferable to use Al in which pattern formation processing is easy. The Al thin film is formed as film over the entire surface of the third insulating layer 19, and photolithographic processing of a predetermined pattern is implemented. Thereafter, e.g., etching processing using etchant such as phosphoric acid, etc. is implemented so that formation of respective patterns is carried out.

At the thin film layer 20, surface layer side wiring layer in which inductor element for low frequency is formed as film is formed by, e.g., copper electrolytic plating method. In the copper electrolytic plating method, copper thin film layer acting (functioning) as electrode for taking out electric field is formed over the entire surface of insulating layer formed as film by sputtering method, etc. on the inner layer side wiring layer. In the copper electrolytic plating method, in order to improve adhesion of copper thin film layer with respect to insulating layer, it is preferable to form, e.g., nickel thin film as barrier layer. In the copper electrolytic plating method, resist for plating is formed as pattern on copper thin film layer thereafter to carry out copper electrolytic plating to form copper pattern. In the copper electrolytic plating method, resist for plating is rinsed and removed thereafter to remove copper thin film layer of unnecessary portion by etching processing. The inductor element is formed as thick film with large film thickness by such a copper electrolytic plating method so that series resistance value is reduce. Thus, lowering of loss is realized.

In the high frequency module 1, as shown in FIG. 3, resist material is coated onto an uppermost wiring portion 23 of the high frequency circuit unit 3 and the second wiring layer 9 of the base substrate 2 so that protective layer is formed. In the high frequency module 1, photolithographic processing is implemented to the protective layer so that lands formed at the uppermost wiring portion 23 and lands 13 formed at the second wiring layer 9 are faced to the external.

In the high frequency module 1, e.g., electroless nickel plating or copper plating is implemented to respective lands so that terminals for realizing electrical connection of elements are formed. In the high frequency module 1, plural MEMS switches 4, high frequency ICs and/or suitable chip components are loaded (mounted) through respective lands on the uppermost layer wiring portion 23 of the high frequency circuit unit 3. The high frequency module 1 is loaded (mounted) on interposer substrate through the lands 13 of the second wiring layer 9.

Figure 6:
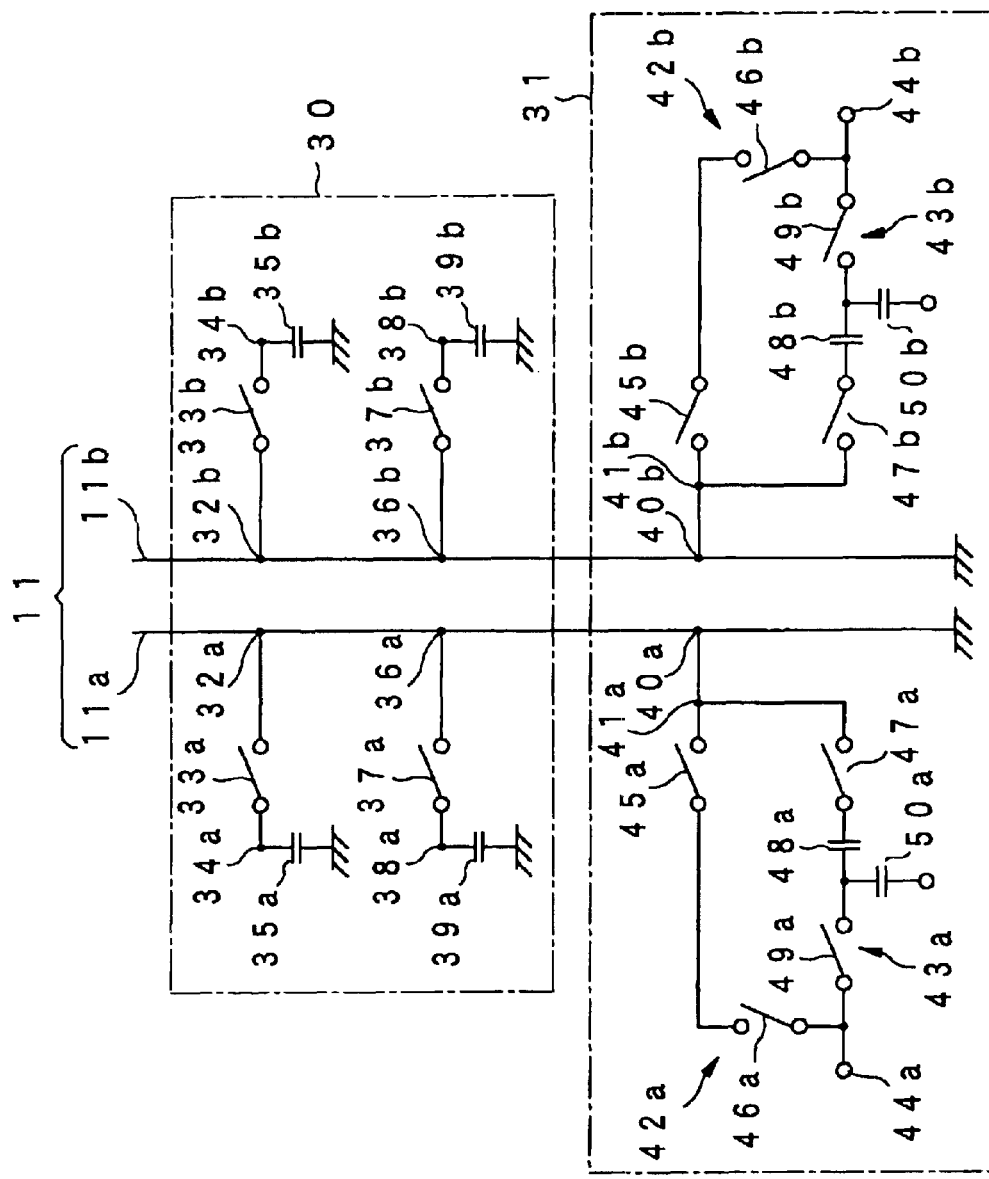
FIG. 6 is a circuit diagram showing circuit configuration of band-pass filter unit.

The configuration of the band-pass filter circuit unit 62 constituted at the high frequency module 1 will be described in detail with reference to FIGS. 5 and 6. The high frequency module 1 constitutes the band-pass filter circuit unit 62 which automatically switches the pass-frequency characteristic as described above by the coupler 1, the capacitor element 18 and the plural MEMS switches 4. The band-pass filter circuit unit 62 comprises, as the detail thereof will be described later, a capacity switching section 30 for carrying out capacity switching of the coupler 11, and an impedance matching section 31 for matching impedance of the coupler 11 which has been caused to undergo capacity switching so that optimum condition is provided.

At the high frequency module 1, there is formed the coupler 11 comprised of a pair of conductive patterns 11a, 11b in which one end side is shorted to the first wiring layer 8 of the base substrate 2 and the other end side thereof is opened as described above. The capacity switching section 30 is constituted substantially at the central portion from the open end of the conductive patterns 11a, 11b, and the impedance matching section 31 is constituted substantially at the central portion. It is a matter of course that the high frequency module 1 is not limited to such configuration.

The configuration of the capacity switching section 30 will be described. First MEMS switches 33a, 33b mounted at the third wiring layer 22 of the high frequency circuit unit 3 side are respectively connected to the conductive patterns 11a, 11b through first interlayer connection vias 32a, 32b at respective opening end sides. The respective first MEMS switches 33 are respectively connected to first capacitor elements 35a, 35b formed at the third wiring layer 22 through first intralayer connection vias 34a, 34b. The first MEMS switches 33 carry out ON operation when control signal C1 is "H" to respectively load parallel capacities of the respective first capacitor elements 35 with respect to the respective conductive patterns 11a, 11b.

Moreover, second MEMS switches 37a, 37b mounted at the third wiring layer 22 of the high frequency circuit unit 3 side are respectively connected to the conductive patterns 11a, 11b through second interlayer connection vias 36a, 36b substantially at respective central portions. The respective second MEMS switches 37 are respectively connected to second capacitor elements 39a, 39b formed at the third wiring layer 22 through second intralayer connection vias 38a, 38b. The second MEMS switches 37 also carry out ON operation when control signal C1 is "H" to respectively load parallel capacities of the respective second capacitor elements 39 with respect to the respective conductive patterns 11a, 11b.

The coupler 11 is formed so that it has frequency component of $\lambda/4$ of carrier wave where frequency is caused to be 5 GHz on the basis of the the distributed parameter design as described above. The capacity switching section 30 respectively loads parallel capacities of first capacity elements 35 and second capacitor elements 39 formed as thin film by the lumped parameter design by switching with respect to this coupler 11. Accordingly, the coupler 11 has a pass-characteristic where frequency component of the frequency band lower than pass-frequency band based on the initial electric wavelength characteristic is permitted to be passed by load of parallel capacities from respective capacitor elements. The capacity switching section 30 is caused to be of the configuration such that the coupler 11 has frequency component of $\lambda/4$ of carrier wave signal of 2.45 GHz band by suitably setting parallel capacities of the first capacitor elements 35 and the second capacitor elements 39. Accordingly, in the high frequency module 1, carrier wave signal where frequency component is 5 GHz and carrier wave signal where frequency component is 2.45 GHz can be compatibly used in the wireless system.

In the high frequency module 1, capacity switching of the coupler 11 by the above-described capacity switching section 30 is carried out, whereby impedance capacity of this coupler 11 changes. As a result, loss of input/output transmission power of high frequency signal takes place. Accordingly, in the high frequency module 1, the impedance matching section 31 is provided at an input/output unit 40 of the coupler 11 to switch capacitive load of the thin film capacitor so that optimum impedance matching is carried out.

The configuration of the impedance matching section 31 will be described. As shown in FIG. 5, the conductive patterns 11a, 11b are connected to high frequency circuit unit 3 through third interlayer connection vias 41a, 41b substantially at the central portion to thereby constitute the input/output unit 40 for high frequency signal. First capacitive load circuits 42a, 42b and second capacitive load circuits 43a, 43b are respectively connected to the conductive patterns 11a, 11b to carry out switching between these respective first and second capacitive load circuits 42 and 43 so that impedance matching between input and output is realized.

The respective first capacitive load circuits 42 are comprised of a series circuit of third MEMS switches 45a, 45b and fourth MEMS switches 46a, 46b in which one ends are respectively connected to the respective third interlayer connection vias 41 and the other ends are respectively connected to input/output terminals 44a, 44b. The respective third and fourth MEMS switches 45 and 46 carry out ON operation when control signal C1 is "H" to connect the respective conductive patterns 11a, 11b and the respective input/output terminals 44.

The respective second capacitive load circuits 43 are also adapted so that one ends are respectively connected to the respective third interlayer connection vias 41 and the other ends are respectively connected to the respective input/output terminals 44 in parallel with the respective first capacitive load circuits 42. The second capacitive load circuit 43 is comprised of a series circuit of fifth MEMS switches 47a, 47b, third capacitor elements 48a, 48b, and sixth MEMS switches 49a, 49b. The second capacitive load circuit 43 includes fourth capacitor elements 50a, 50b branched from the third capacitor elements 48 and the sixth MEMS switches 49 and having one end grounded. The respective fifth and sixth MEMS switches 47 and 49 carry out ON operation when control signal C2 is "H" to connect the respective conductive patterns 11a, 11b and the respective input/output terminals 44.

In the impedance matching section 31 constituted as described above, in the case where the high frequency module 1 is used in the frequency band where frequency of carrier wave signal is caused to be 5 GHz as described above, control signals in which control signal C1 is "L" and control signal C2 is "H" are inputted. From this fact, the respective first capacitive load circuits 42 are held in OFF state and the respective second capacitive load circuits 43 are placed in ON state. Accordingly, at the impedance matching section 31, parallel capacities of the third capacitor elements 48 and the fourth capacitor elements 50 are respectively loaded between respective conductive patterns 11a, 11b and the respective input/output terminals 44.

On the other hand, at the impedance matching section 31, in the case where the high frequency module 1 is used in the frequency band where frequency of carrier wave signal is caused to be 2.45 GHz, control signals in which control signal C1 is "H" and control signal C2 is "L" are inputted. From this fact, the respective first capacitive load circuits 42 are placed in ON state and the respective second capacitive load circuits 43 are switched into OFF state. Accordingly, the impedance matching section 31 stops load of parallel capacities of the third and fourth capacitor elements 48 and 50 between the respective conductive patterns 11a, 11b and the respective input/output terminals 44.

At the impedance matching section 31, the above-described switching operation is carried out in a manner interlocking with switching operation of the capacity switching section 30. Accordingly, at the high frequency module 1, switching of the pass-frequency characteristic of the coupler 11 is carried out by switching operation of the above-described capacity switching section 30 so that compatible use is permitted in the wireless systems at 5 GHz frequency band and 2.45 GHz frequency band. Impedance matching between input and output is carried out by switching operation of the impedance matching section 31. Thus, the high frequency module 1 becomes operative so that transmission of input/output signals is carried out in the optimum state.

Practical configuration of the band-pass filter circuit unit 62 will be explained with reference to FIGS. 7A and 7B, and FIGS. 8A and 8B.

Figure 7A:
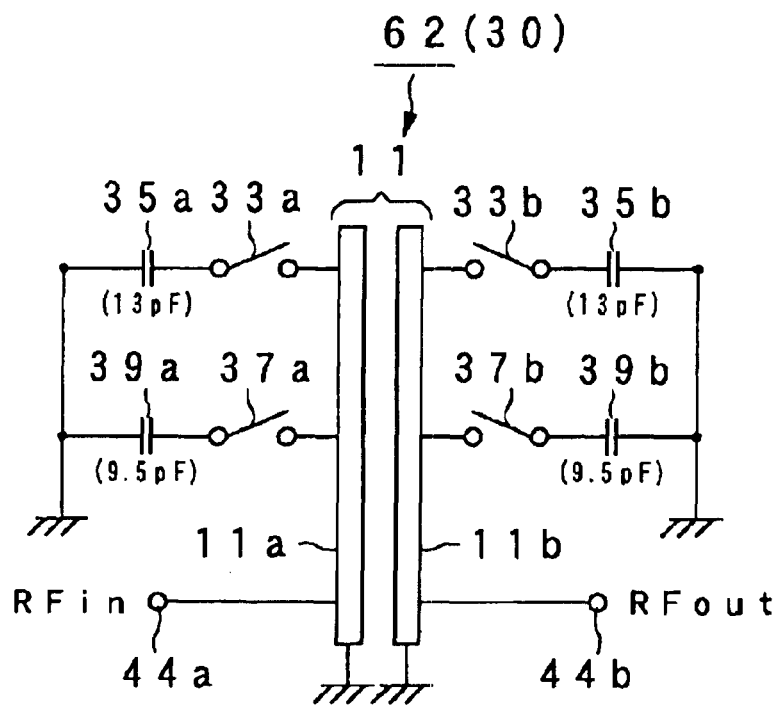
FIG. 7A is an explanatory view showing, in a model form, the state where capacity switching of band-pass filter unit is carried out so that carrier frequency band specification of 2.45 GHz is provided.

At the band-pass filter circuit unit 62, as shown in FIG. 7A, first capacitor elements 35 of the capacity switching section 30 respectively have capacity of 13 pF, and second capacitor elements 39 respectively have capacity of 9 pF. The band-pass filter circuit unit 62 has pass-frequency characteristic in 5 GHz carrier frequency band.

Figure 7B:
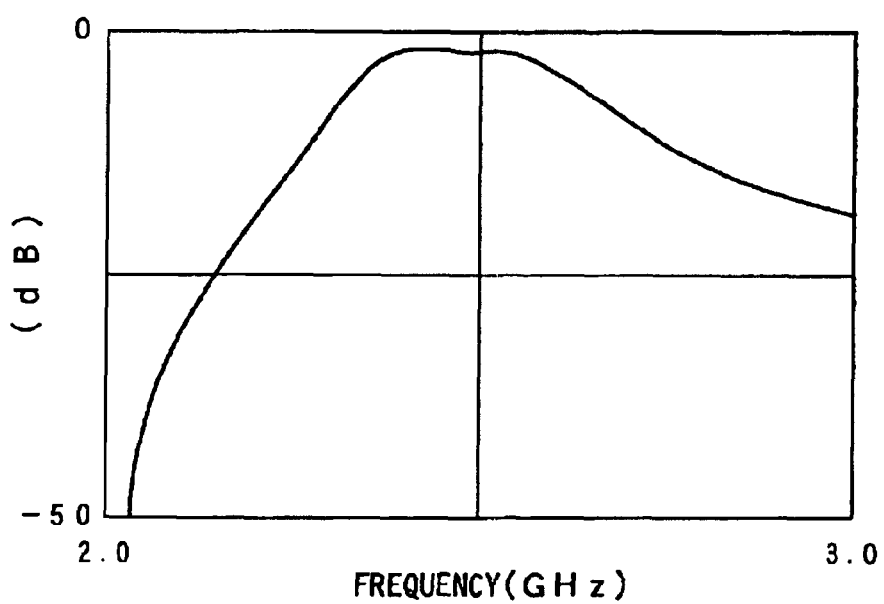
FIG. 7B is a characteristic diagram of pass-frequency based on the simulation result.

In the band-pass filter circuit unit 62, the first and second MEMS switches 33 and 37 carry out ON operation as shown in FIG. 7A by "H" input of control signal C1. Thus, parallel capacity of the first and second capacitor elements 35 and 39 is loaded with respect to the coupler 11. Thus, the band-pass filter circuit unit 62 constitutes a band-pass filter having the maximum pass-frequency characteristic in the 2.45 GHz carrier frequency band as shown in FIG. 7B. Additionally, FIG. 7B is a charcteristic diagram of simulation result.

Figure 8A:
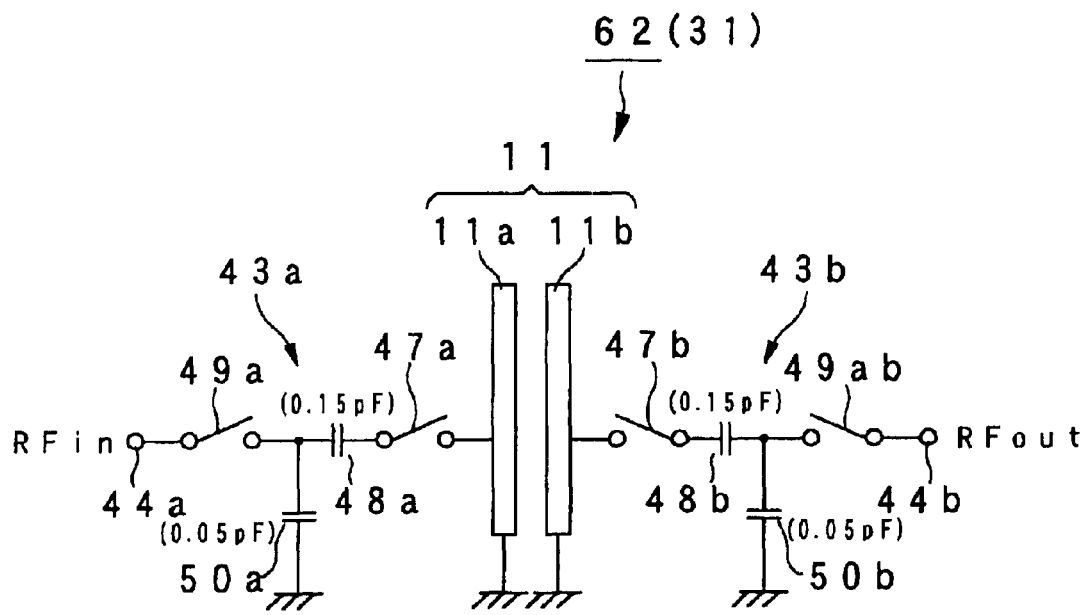
FIG. 8A is an explanatory view showing, in a model form, the state where impedance switching of band-pass filter unit is carried out so that 2.45 GHz carrier frequency band specification is provided.

Moreover, in the band-pass filter circuit unit 62, as shown in FIG. 8A, the third capacitor elements 48 of the impedance matching section 31 respectively have capacity of 0.15 pF and the fourth capacitor elements 50 thereof respectively have capacity of 0.05 pF. When the first capacitive load circuit 42 is placed in ON state and the second capacitive load circuit 43 is placed in OFF state, the band-pass filter circuit unit 62 has impedance capacity corresponding to pass-frequency characteristic of the 5 GHz carrier frequency band.

Figure 8B:
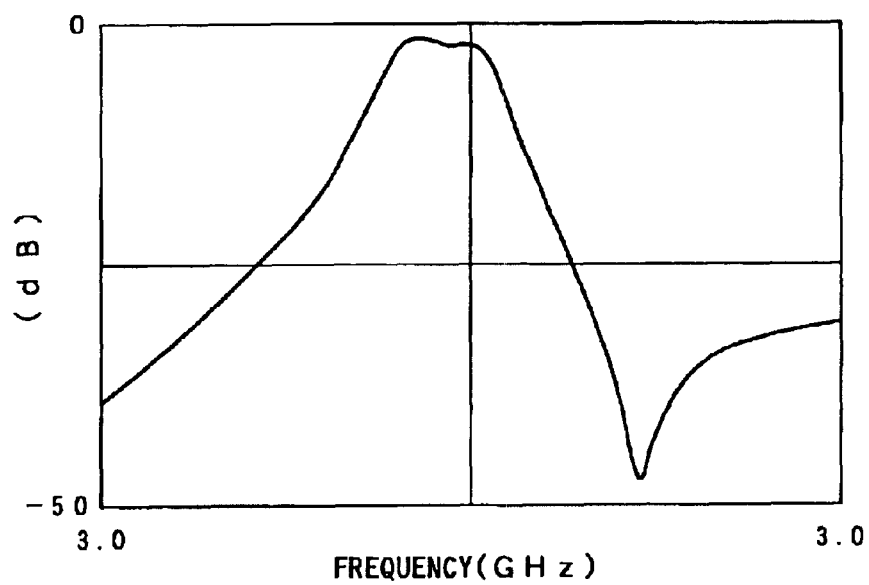
FIG. 8B is a characteristic diagram of pass-frequency based on the simulation result.

At the band-pass filter circuit unit 62, when control signals in which control signal C1 is "L" and control signal C2 is "H" are inputted, the first capacitive load circuit 42 is placed in OFF state and the fifth and sixth MEMS switches 47 and 49 carry out ON operation, whereby the second capacitive load circuit 43 is placed in ON state. At the band-pass filter circuit unit 62, parallel capacity of the third and fourth capacitor elements 48 and 50 is loaded with respect to the coupler 11 so that impedance matching is realized. Thus, as shown in FIG. 8, the band-pass filter circuit unit 62 constitutes band-pass filter having the maximum pass-frequency characteristic at the 5 GHz carrier frequency band. Additionally, FIG. 8B is also a characteristic diagram of simulation result.

Figure 9A:
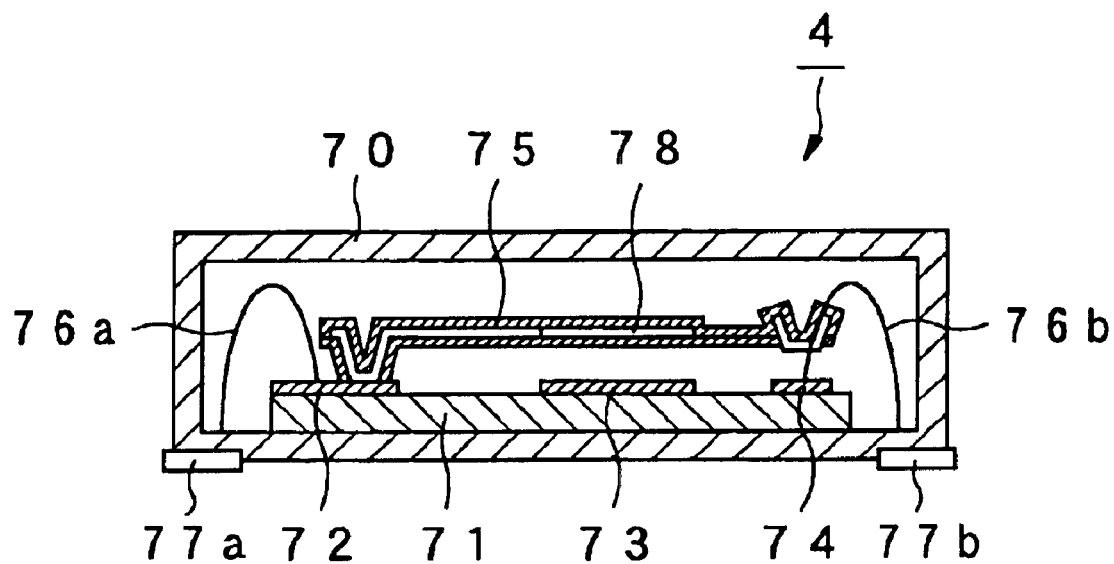

As described above, the high frequency module 1 comprises a large number of MEMS switches 4 which carry out band switching. As shown in FIG. 9A, the entirety of the MEMS switch 4 is covered by an insulating cover 70. The MEMS switch 4 is adapted so that a first fixed contact 72, a second fixed contact 73 and a third fixed contact 74 are formed on a silicon substrate 71, wherein a thin plate shaped movable contact piece 75 having flexibility is rotatably supported at the first fixed contact 72 in the cantilever state. The MEMS switch 4 is adapted so that the first fixed contact 72 and the third fixed contact 74 are respectively caused to be input/output contacts, and are respectively connected to input/output terminals 77a, 77b provided at the insulating cover 70 through leads 76a, 76b.

At the MEMS switch 4, one end portion of the movable contact piece 75 is caused to be normally closed contact with respect to the first fixed contact 72 of the silicon substrate 71 side, and the free and thereof constitutes normally open contact with respect to the third fixed contact 74. At the movable contact piece 75, an electrode 78 is provided therwithin in correspondence with the second fixed contact 73 of the central portion. As shown in FIG. 9A, in the ordinary state, at the MEMS switch 4, one end of the movable contact piece 75 is in contact with the first fixed contact 72, and the other end thereof is held in the state where it is not in contact with the third fixed contact 74.

Figure 9B:
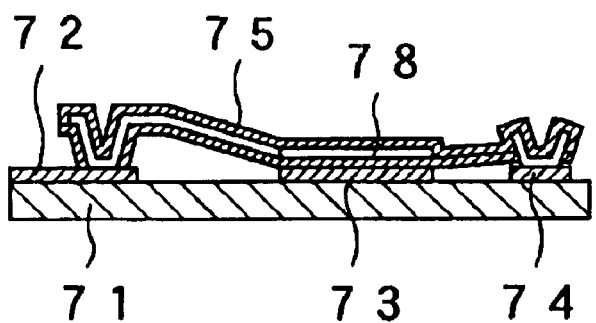

When control signal of band switching is inputted to the MEMS switches 4 as described above, drive voltage is applied to the second fixed contact 73 and the inside electrode 78 of the movable contact piece 75. Thus, at the MEMS switches 4, attractive force is produced between the second fixed contact 73 and the movable contact piece 75. Thus, as shown in FIG. 9B, the movable contact piece 75 is caused to undergo displacement operation toward the silicon substrate 71 side with the first fixed contact 72 being as fulcrum so that the free end thereof is connected to the third fixed contact 74. Thus, this connection state is held.

When control signal of band switching is inputted to the MEMS switches 4, drive voltage of inverse bias is applied to the second fixed contact 73 and the inside electrode 78 of the movable contact piece 75. Thus, at the MEMS switches 4, the movable contact piece 75 returns to the initial state so that connection state to the third fixed contact 74 is released. Since the MEMS switch 4 is extremely small, and is a switch in which holding current for holding the operating state is unnecessary, even if such MEMS switch is mounted on the high frequency module 1, there is no possibility that it becomes large, and low power consumption is realized.

It is to be noted that while the band-pass filter circuit unit 62 is caused to be of the configuration in which compatible use is permitted at the 5 GHz carrier frequency band and the 2.45 GHz carrier frequency band in the above-described high frequency module 1, such fundamental configuration may be employed so that compatible use is also carried out by combination of other carrier frequency bands. In this case, it is a matter of course that the band-pass filter circuit unit 62 is suitably changed with respect to practical circuit configurations shown in FIGS. 5 to 8. It is a matter of course that the fundamental configuration of the band-pass filter circuit unit 62 can be also applied to other filter element such as low-pass filter, high-pass filter and band-stop filter, etc, or antenna element, etc. constituting the high frequency circuit unit.

Industrial Applicability

The high frequency module substrate device according to the present invention is caused to be of the configuration in which thin film capacitor is constituted between base substrate in which the uppermost layer is flattened with organic substrate being as core substrate so that buildup formation surface is constituted and high frequency circuit unit of the lumped parameter design formed on the buildup formation surface in a laminated manner to carry out load switching of parallel capacity with respect to coupler having frequency characteristic of λ/4 which has been caused to undergo distributed parameter design at the base substrate portion side of the thin film capacitor through switching means. From this fact, band-pass filter function in which compatible use can be made with high pass-characteristic with respect to different carrier frequency bands and reliability is extremely high can be constituted with ease without increasing mounting parts.

Accordingly, since the high frequency module substrate device according to the present invention is small and is light in weight, it is suitably used for portable electronic equipments, etc. to permit use of these equipments with compatibility with respect to plural wireless systems different in the carrier frequency band, thus making it possible to add information communication function and/or storage function, etc.

In the high frequency module substrate device according to the present invention, wavelength shortening effect and reduction in parasitic capacity by the base substrate of the high dielectric constant characteristic are realized, and the characteristic of the band-pass filter function is satisfactorily held irrespective of the band of carrier frequency. Thus, miniaturization and improvement in the characteristic are realized.

What is claimed is:

1. A high frequency module substrate device comprising:

a base substrate in which a wiring layer is formed through an insulating layer on the principal surface of a core substrate comprised of an organic substrate, and at least a distributed parameter circuit pattern including a coupler of one side short type line and one side open type line having frequency characteristic of λ/4 is formed within this wiring layer and the principal surface of the uppermost layer is flattened to constitute a buildup formation surface;

a high frequency circuit unit including a lumped parameter circuit pattern and passive elements adapted so that a wiring layer is formed on the buildup formation surface of the base substrate through an insulating layer, and formed in correspondence with the distributed parameter circuit pattern within the wiring layer to constitute a thin film capacitor; and select switch means provided between connection patterns for carrying out interlayer connection between the thin film capacitor and the coupler to switch electric connection state between the thin film capacitor and the coupler, thus to carry out switching of load state of parallel capacity with respect to the coupler of the thin film capacitor through the select switch means to thereby carry out band switching.

2. The high frequency module substrate device as set forth in claim 1, wherein the thin film capacitor is adapted so that parallel capacity is loaded with respect to the coupler through the select switch means to thereby constitute a band-pass filter circuit having a pass-frequency band characteristic of low frequency band with respect to frequency band derived from the coupler.

3. The high frequency module substrate device as set forth in claim 2, wherein the thin film capacitor is connected to an input/output terminal portion for high frequency signal with respect to the coupler through the select switch means, and, wherein when band switching by switching operation of the select switch means is carried out, impedance matching with respect to input/output with respect to the coupler is carried out to thereby constitute a band-pass filter circuit having a pass-frequency band characteristic in the vicinity of frequency band derived from the coupler.

4. The high frequency module substrate device as set forth in claim 1, wherein MEMS switch is used as the select switch means.

* * * * *